United States Patent
Ichioka et al.

(10) Patent No.: US 11,518,876 B2
(45) Date of Patent: Dec. 6, 2022

(54) PHOTOSENSITIVE RESIN COMPOSITION AND PHOTOSENSITIVE DRY FILM

(71) Applicant: Shin-Etsu Chemical Co., Ltd., Tokyo (JP)

(72) Inventors: Yoichiro Ichioka, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/666,757

(22) Filed: Oct. 29, 2019

(65) Prior Publication Data

US 2020/0140678 A1    May 7, 2020

(30) Foreign Application Priority Data

Nov. 1, 2018 (JP) ............... JP2018-206503

(51) Int. Cl.
| | | |
|---|---|---|
| *C08L 65/02* | (2006.01) | |
| *C08G 59/14* | (2006.01) | |
| *C08J 7/18* | (2006.01) | |
| *C08K 5/00* | (2006.01) | |
| *C08L 63/00* | (2006.01) | |
| *C08L 83/04* | (2006.01) | |

(52) U.S. Cl.
CPC .......... *C08L 65/02* (2013.01); *C08G 59/1411* (2013.01); *C08G 59/1422* (2013.01); *C08J 7/18* (2013.01); *C08K 5/0025* (2013.01); *C08L 63/00* (2013.01); *C08L 83/04* (2013.01); *C08L 2203/16* (2013.01); *C08L 2203/202* (2013.01)

(58) Field of Classification Search
CPC .......... C08L 65/02; C08L 63/00; C08L 83/04; C08L 2203/16; C08L 2203/202; C08G 59/1411; C08G 59/1422; C08J 17/18; C08J 7/18; C08K 5/0025
USPC ............................................. 525/524
See application file for complete search history.

(56) References Cited

U.S. PATENT DOCUMENTS

| | | | | |
|---|---|---|---|---|
| 2005/0019691 | A1* | 1/2005 | Tseng | G03F 7/0392 430/270.1 |
| 2011/0143103 | A1* | 6/2011 | Furuya | C08G 73/1039 428/195.1 |
| 2014/0255833 | A1 | 9/2014 | Yasuda et al. | |
| 2015/0299457 | A1* | 10/2015 | Fu | C08L 63/10 428/35.8 |
| 2017/0255097 | A1* | 9/2017 | Takemura | G03F 7/0045 |

FOREIGN PATENT DOCUMENTS

| | | |
|---|---|---|
| EP | 2 602 661 A1 | 6/2013 |
| EP | 3 214 497 A1 | 9/2017 |
| JP | 4183459 B2 | 11/2008 |
| JP | 4918313 B2 | 4/2012 |

OTHER PUBLICATIONS

Extended Search Report dated Apr. 3, 2020, issued in counterpart EP Application No. 19203164.9 (7 pages).
Hanamura K. et al., "Halogen-free photosensitive resin composition comprises an epoxy acrylate resin, phosphorous-containing epoxy resin, diluent, a curing agent, a curing promoter, a sensitizer and inorganic filler as the essential components", WPI/THOMSON, vol. 2001, No. 67, Mar. 21, 2001; Cited in EESR dated Apr. 3, 2020.

\* cited by examiner

*Primary Examiner* — David T Karst
(74) *Attorney, Agent, or Firm* — WHDA, LLP

(57) ABSTRACT

A photosensitive resin composition is provided comprising (A) 100 pbw of a phenolic hydroxyl group-containing resin, and (B) 0.1-18 pbw of an epoxy additive in the form of a compound containing 1-8 epoxy groups per molecule, containing nitrogen, sulfur or phosphorus, and having a molecular weight of 50-6,000. The composition has an improved bonding force to metal wirings.

9 Claims, No Drawings

PHOTOSENSITIVE RESIN COMPOSITION AND PHOTOSENSITIVE DRY FILM

CROSS-REFERENCE TO RELATED APPLICATION

This non-provisional application claims priority under 35 U.S.C. § 119(a) on Patent Application No. 2018-206503 filed in Japan on Nov. 1, 2018, the entire contents of which are hereby incorporated by reference.

TECHNICAL FIELD

This invention relates to a photosensitive resin composition, photosensitive dry film, and pattern forming process.

BACKGROUND ART

To meet the recent demand for electronic tools of compact size and high performance, memories and CPU mounted in such tools are reduced in pattern size. As the pattern miniaturization technology approaches the limit, a structure of multiple wiring layers is indispensable for achieving a higher level of computation. The structure of multiple wiring layers is obtained by forming a first wiring layer, forming an interlayer dielectric film thereon, forming a second wiring layer thereon, and further forming an interlayer dielectric film. These steps are repeated until a structure having two or more wiring layers stacked is obtained. In this process, the procedure of intentionally corroding a copper wiring to provide the copper wiring with ultrafine irregularities for enhancing the bonding force between the interlayer dielectric film and the copper wiring is adopted in order to impart sufficient reliability to the device. However, as a result of the advance of electronic devices to higher performance, there occurs a situation where irregularities on the copper wiring can adversely affect the performance of the device. There is a demand for a material capable of establishing a satisfactory bond to substantially non-irregular copper wirings.

A number of efforts have been made to gain a satisfactory bonding force. For example, Patent Documents 1 and 2 disclose the use of silane coupling agents and titanate coupling agents. Since copper generally has no functional groups for coupling, the coupling agents sometimes fail to exert a sufficient effect of enhancing a bonding force.

CITATION LIST

Patent Document 1: JP 4918313
Patent Document 2: JP 4183459

SUMMARY OF INVENTION

An object of the invention is to provide a photosensitive resin composition having an improved bonding force to metal wirings, especially copper wirings.

Since copper used as wirings is free of functional groups, the bonding force enhancement approach based on the reaction of a coupling agent with functional groups on a subject is ineffective. It is estimated that the coordination of such elements as nitrogen, sulfur and phosphorus would be effective. These elements often have nucleophilicity or basicity, which can adversely affect the photosensitive mechanism. Also most such compounds are incompatible with resin compositions, resulting in a loss of reliability.

The inventors have found that a photosensitive resin composition comprising a phenolic hydroxyl group-containing resin and an epoxy additive in the form of a compound containing 1 to 8 epoxy groups per molecule, containing nitrogen, sulfur and/or phosphorus, and having a molecular weight of 50 to 6,000 forms a coating which exhibits an improved bonding force to copper and good reliability at no sacrifice of photosensitivity.

In one aspect, the invention provides a photosensitive resin composition comprising (A) a resin having a phenolic hydroxyl group and (B) an epoxy additive in the form of a compound containing 1 to 8 epoxy groups per molecule, containing at least one element selected from nitrogen, sulfur and phosphorus, and having a molecular weight of 50 to 6,000, the epoxy additive (B) being present in an amount of 0.1 to 18 parts by weight per 100 parts by weight of the resin (A).

In a preferred embodiment, the resin (A) is at least one member selected from the group consisting of polybenzoxazole, polyimide, epoxy resins, and silicone-modified resins of the foregoing.

In a preferred embodiment, the composition may further comprise (C) a crosslinker, (D) a photoacid generator, and/or (E) an organic solvent.

In another aspect, the invention provides a photosensitive resin coating obtained from the photosensitive resin composition defined above.

In a further aspect, the invention provides a photosensitive dry film comprising the photosensitive resin coating defined above.

In a further aspect, the invention provides a pattern forming process comprising the steps of:
(i) using the photosensitive resin composition defined above to form a photosensitive resin coating on a substrate,
(ii) exposing the photosensitive resin coating to radiation, and
(iii) developing the exposed photosensitive resin coating in a developer.

Alternatively, the pattern forming process may comprise the steps of:
(i) using the photosensitive dry film defined above to form a photosensitive resin coating on a substrate,
(ii) exposing the photosensitive resin coating to radiation, and
(iii) developing the exposed photosensitive resin coating in a developer.

Advantageous Effects of Invention

Since the epoxy additive contains nitrogen, sulfur or phosphorus atoms capable of interaction with copper, it contributes to an improvement in bonding force at the copper interface. At the same time, since the epoxy additive has epoxy groups, which react with phenolic hydroxyl groups in the composition, it is fixed in the cured product, eliminating the risk of precipitation or separation. Since the amount of the epoxy additive added is limited, the composition can be used without a drop of photosensitivity. As a result, the composition is effectively applicable to device chips.

DESCRIPTION OF PREFERRED EMBODIMENTS

As used herein, the notation (Cn-Cm) means a group containing from n to m carbon atoms per group. In chemical formulae, the broken line designates a valence bond.

(A) Phenolic Hydroxyl Group-Containing Resin

The resin serving as component (A) in the photosensitive resin composition of the invention is not particularly limited as long as it has a phenolic hydroxyl group. The resin (A) is preferably selected from among polybenzoxazole, polyimide, epoxy resins, and silicone-modified resins of the foregoing because the epoxy additive (B) exerts its effect to a greater extent when combined with such resins.

The polybenzoxazole and silicone-modified polybenzoxazole may be selected from a wide range of commonly used ones, preferably having the following formula (1).

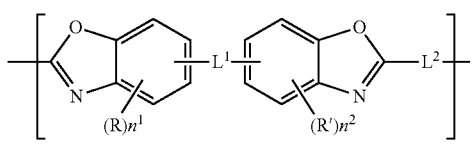
(1)

In formula (1), $L^1$ is a single bond or a $C_1$-$C_{10}$ divalent organic group, R and R' are each independently a $C_1$-$C_6$ monovalent organic group, $L^2$ is a divalent organic group which may contain a silicone skeleton, and $n^1$ and $n^2$ are each independently an integer of 0 to 2.

The polyimide and silicone-modified polyimide should preferably have the formula (2), but are not limited thereto.

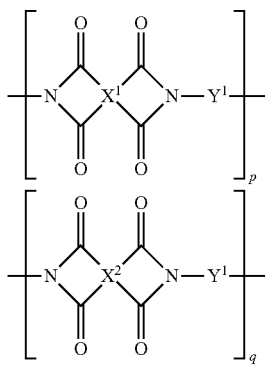
(2)

In formula (2), $X^1$ is a tetravalent group having the formula (3).

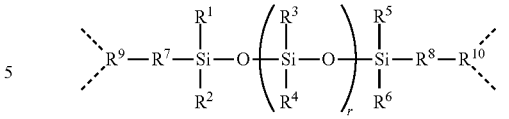
(3)

In formula (3), $R^1$ to $R^6$ are each independently a $C_1$-$C_8$ monovalent hydrocarbon group. The monovalent hydrocarbon group may be straight, branched or cyclic.

Examples thereof include alkyl groups such as methyl, ethyl, propyl, butyl, pentyl, hexyl, cycloalkyl groups such as cyclopentyl and cyclohexyl, aryl groups such as phenyl, aralkyl groups such as benzyl and phenethyl, and alkenyl groups such as vinyl, 1-propenyl, 2-propenyl, isopropenyl, and butenyl. Inter alia, methyl, ethyl, phenyl and vinyl are preferred for availability of reactants.

In formula (3), $R^7$ and $R^8$ are each independently a single bond or a $C_1$-$C_{12}$ divalent hydrocarbon group. The divalent hydrocarbon group may be straight, branched or cyclic. Examples thereof include methylene, ethane-1,1-diyl, ethane-1,2-diyl, propane-1,3-diyl, butane-1,4-diyl, benzene-1,4-diyl, and biphenyl-4,4'-diyl. Preferably, $R^1$ and $R^8$ each are a single bond, methylene, ethane-1,1-diyl, propane-1,3-diyl or benzene-1,4-diyl.

In formula (3), $R^9$ and $R^{10}$ are each independently a trivalent organic group. The trivalent organic group preferably has 2 to 10 carbon atoms. Examples of the trivalent organic group are shown below, but not limited thereto.

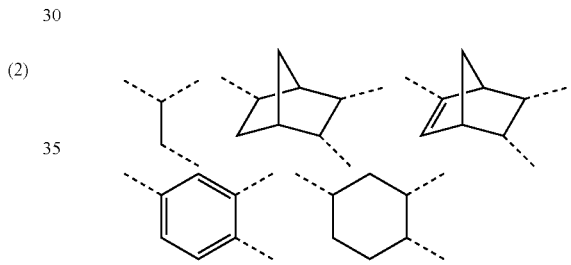

In formula (3), r is an integer of 0 to 120, preferably 3 to 80, and more preferably 5 to 50. In case of r≥2, that is, two or more siloxane units are included, the siloxane units may be of the same type, or two or more different types. Where siloxane units of two or more different types are included, they may be bonded randomly or alternately, or a plurality of blocks of siloxane units of the same type may be included.

Examples of the tetravalent group $X^1$ are shown below, but not limited thereto.

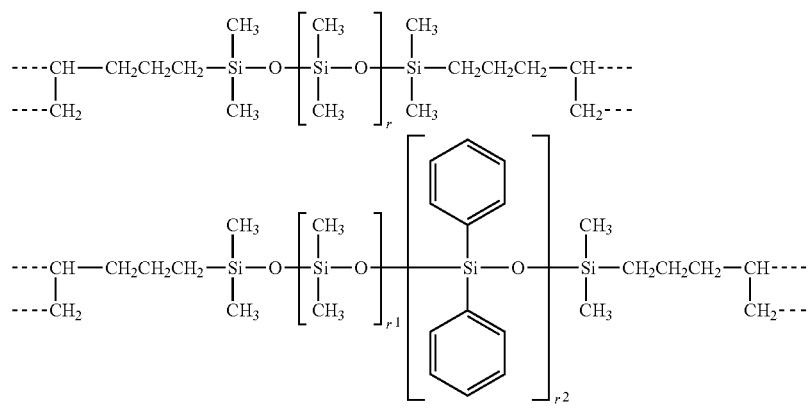

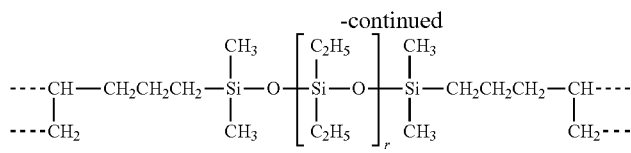
Herein r is as defined above, $r^1$ and $r^2$ are integers in the range: $0 \leq r^1 \leq 119$, $0 \leq r^2 \leq 120$, and $1 \leq r^1 + r^2 \leq 120$.
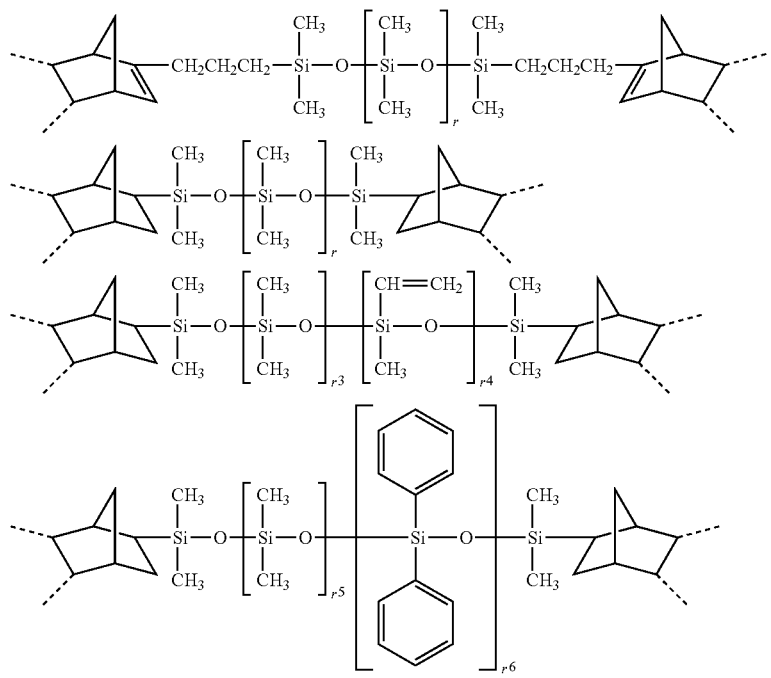
Herein r is as defined above, $r^3$ and $r^4$ are each independently an integer of 0 or at least 1, $r^3 + r^4 = r$, $r^5$ and $r^6$ are each independently an integer of 0 or at least 1, $r^5 + r^6 = r$.
Preferred examples of the tetravalent group $X^1$ are shown below.
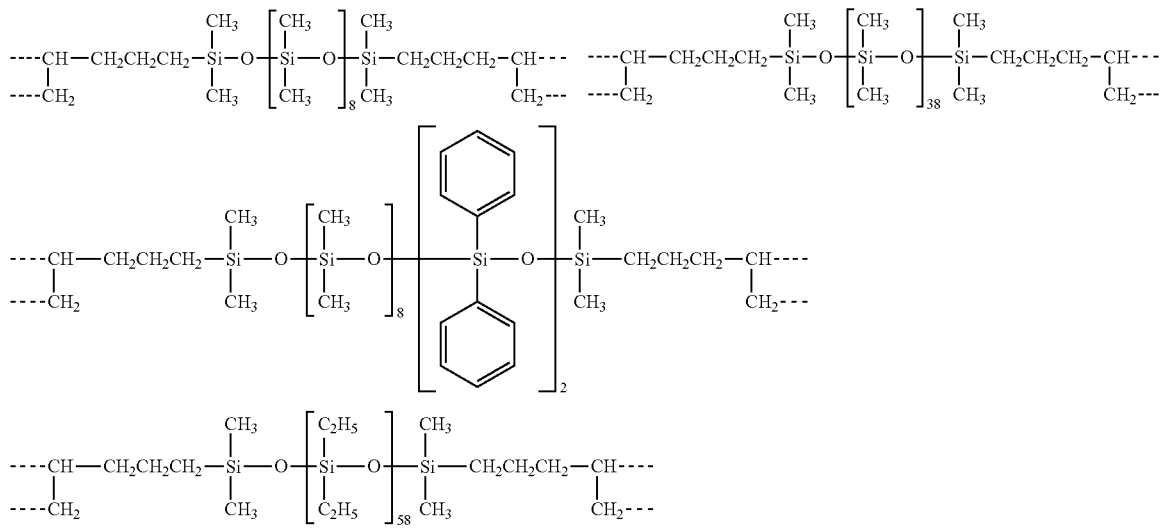

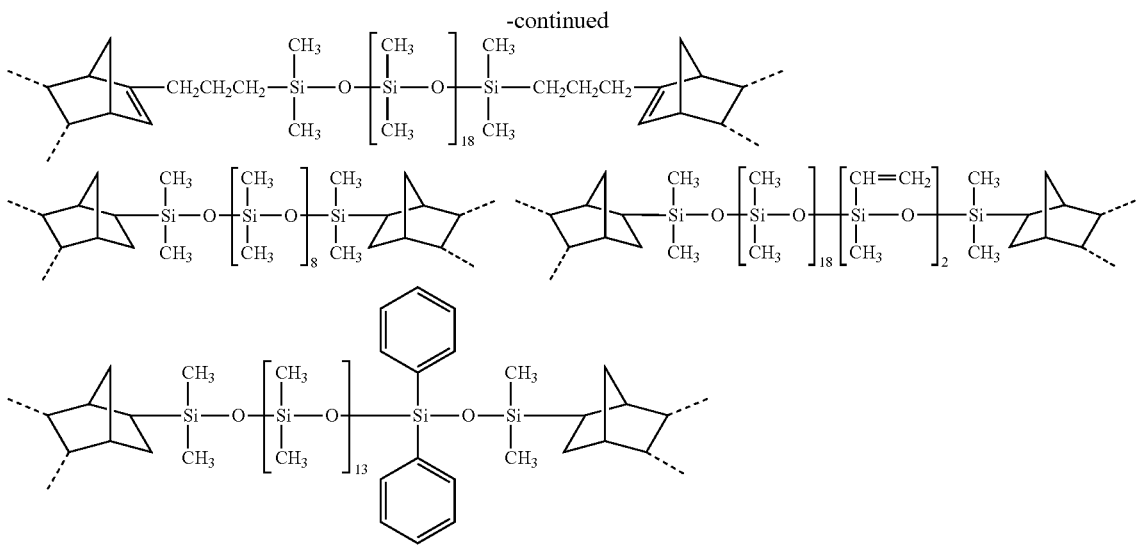

The group $X^1$ may be derived from a modified silicone which is obtained by reacting an organohydrogenpolysiloxane with an acid anhydride having an unsaturated group, for example, succinic anhydride, norbornenedicarboxylic anhydride, propylnadic anhydride, or phthalic anhydride. The number of siloxane units in the acid anhydride-modified polysiloxane distributes in accordance with the distribution of the number of siloxane units in the organohydrogenpolysiloxane. Accordingly, r in formula (3) represents the average number of siloxane units.

In formula (2), $X^2$ is a tetravalent organic group other than the group having formula (3). Although the tetravalent organic group is not particularly limited, preferred examples thereof are shown below.

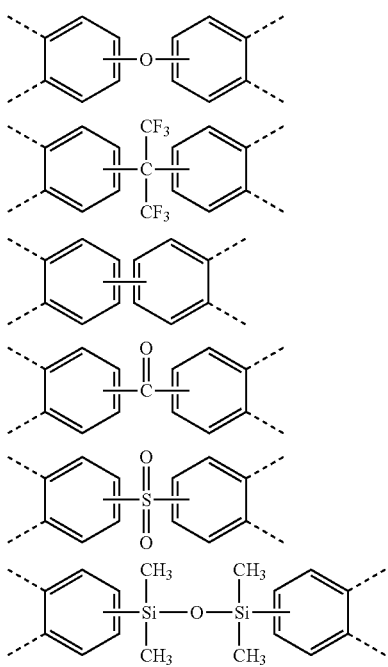

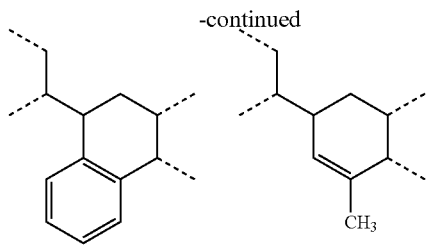

In formula (2), $Y^1$ is a divalent group having at least one phenolic hydroxyl group, represented by the formula (4).

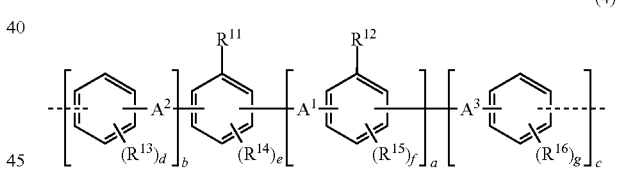

(4)

In formula (4), $A^1$ to $A^3$ are each independently a single bond, methylene group, ether bond, sulfonyl group, amide bond, propane-2,2-diyl, 1,1,1,3,3,3-hexafluoropropane-2,2-diyl, and fluorene-9,9-diyl.

In formula (4), a is an integer of 1 to 10, b is 0 or 1, and c is 0 or 1.

In formula (4), $R^{11}$ to $R^{12}$ are each independently a hydroxyl group or an alcoholic hydroxyl-containing group, at least one of $R^{11}$ to $R^{12}$ being hydroxyl.

Examples of the alcoholic hydroxyl-containing group include —OCH$_2$CH(OH)CH$_2$OH and —OCH(CH$_2$OH)CH$_2$OH.

In formula (4), $R^{13}$ to $R^{16}$ are each independently a $C_1$-$C_4$ alkyl group. Suitable alkyl groups include methyl, ethyl, propyl and butyl, with methyl being preferred. Where each of d to g is 2, each of $R^{13}$ to $R^{16}$ may be the same or different.

In formula (4), d to g are each independently 0, 1 or 2, preferably 0 or 1.

Examples of the group having formula (4) are shown below, but not limited thereto.

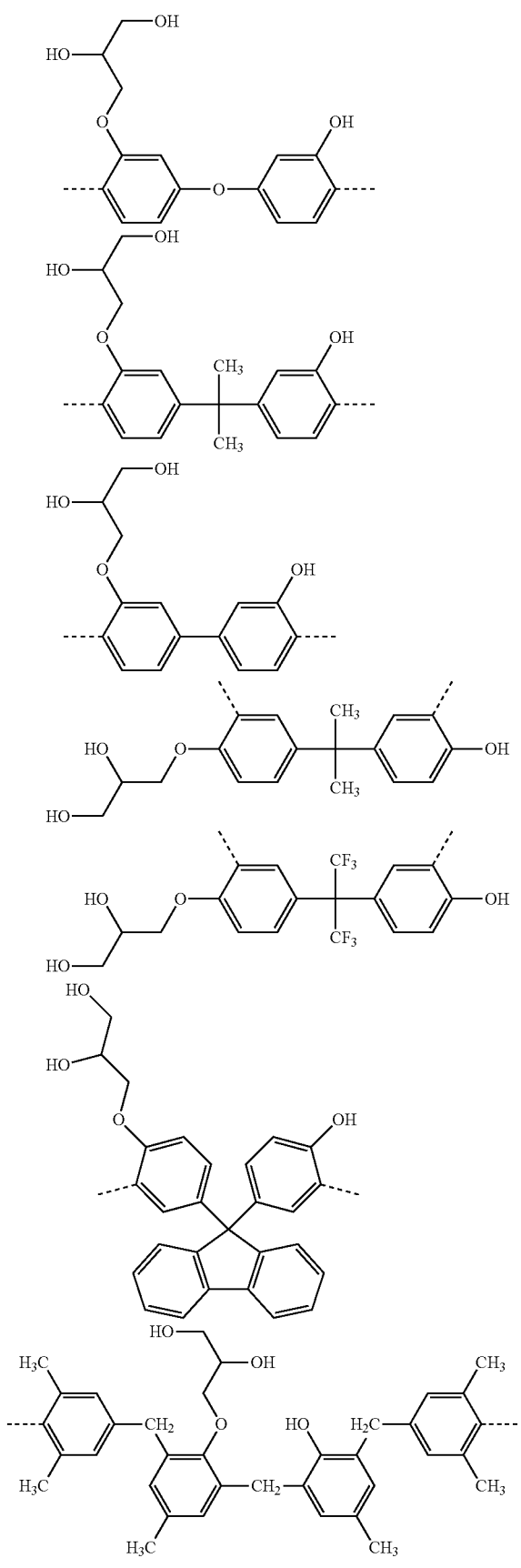

In formula (2), p indicative of the number of recurring units containing $X^1$ is 0 or a positive integer, preferably 1 to 500, and more preferably 3 to 300; and q indicative of the number of recurring units containing $X^2$ is a positive integer, preferably 1 to 500, and more preferably 3 to 300.

Also, p and q are in the range: $0 \leq p/(p+q) \leq 1$. For the silicone-modified polyimide, p is in the range: $0.1 \leq p/(p+q) \leq 1$, more preferably $0.2 \leq p/(p+q) \leq 0.95$, even more preferably $0.5 \leq p/(p+q) \leq 0.9$.

The polyimide and silicone-modified polyimide may comprise recurring units of at least one type selected from recurring units having the formula (2-1) and recurring units having the formula (2-2).

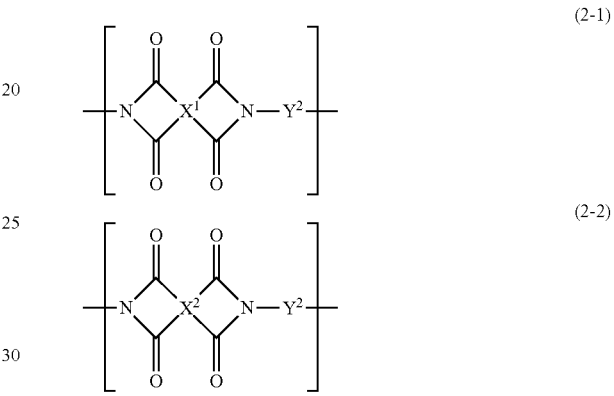

In formulae (2-1) and (2-2), $X^1$ and $X^2$ are as defined above. $Y^2$ is a divalent group other than the group having formula (4). Suitable divalent groups include those groups having formula (4) from which $R^{11}$ and $R^{12}$ are eliminated, and divalent organic groups containing a silicone skeleton.

Where the polyimide comprises recurring units having formula (2-1) and/or recurring units having formula (2-2), the content of these recurring units is arbitrary as long as the benefits of the invention are not impaired.

The polyimide and silicone-modified polyimide preferably have a weight average molecular weight (Mw) of 2,000 to 200,000, more preferably 4,000 to 100,000. As long as Mw is within the range, ease of handling is ensured and a cured product having a sufficient strength is obtained. It is noted throughout the disclosure that Mw is measured by gel permeation chromatography (GPC) versus polystyrene standards using tetrahydrofuran (THF) solvent.

Examples of the epoxy resin and silicone-modified epoxy resin include those having the following formula (5), but are not limited thereto.

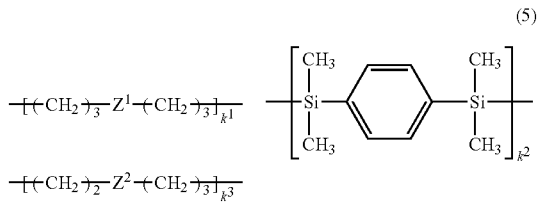

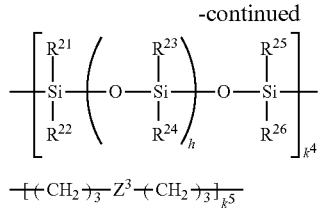

In formula (5), $R^{21}$ to $R^{26}$ are each independently a $C_1$-$C_{20}$ monovalent hydrocarbon group or alkoxy group. Suitable monovalent hydrocarbon groups include straight, branched or cyclic alkyl, alkenyl and alkynyl groups, but are not limited thereto. Preferably, $R^{21}$ to $R^{26}$ are selected from $C_1$-$C_{12}$ monovalent hydrocarbon groups and alkoxy groups, more preferably $C_1$-$C_{10}$ monovalent hydrocarbon groups and alkoxy groups, even more preferably $C_1$-$C_6$ monovalent hydrocarbon groups and alkoxy groups. Preferred illustrative examples of $R^{21}$ to $R^{26}$ include methyl, ethyl, propyl, hexyl, cyclohexyl and phenyl, with methyl and phenyl being more preferred for availability of reactants.

In formula (5), $Z^1$ is a divalent group having the formula (6).

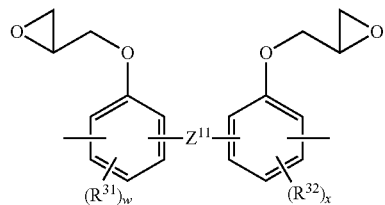

In formula (6), $Z^{11}$ is a single bond, methylene, propane-2,2-diyl, 1,1,1,3,3,3-hexafluoropropane-2,2-diyl, or fluorene-9,9-diyl. $R^{31}$ and $R^{32}$ which may be the same or different are each independently a $C_1$-$C_{20}$ monovalent hydrocarbon group or alkoxy group. $R^{31}$ and $R^{32}$ are preferably $C_1$-$C_4$ alkyl or alkoxy groups, more preferably $C_1$-$C_2$ alkyl or alkoxy groups. Preferred illustrative examples include methyl, ethyl, propyl, tert-butyl, methoxy and ethoxy. The subscripts w and x are each independently an integer of 0 to 2.

In formula (5), $Z^2$ is a divalent group having the formula (7):

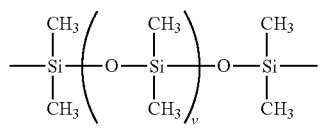

wherein v is an integer of 0 to 300.

In formula (5), $Z^3$ is a divalent group having the formula (8).

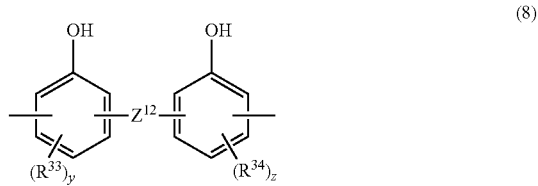

In formula (8), $Z^{12}$ is a single bond, methylene, propane-2,2-diyl, 1,1,1,3,3,3-hexafluoropropane-2,2-diyl, or fluorene-9,9-diyl. $R^{33}$ and $R^{34}$ which may be the same or different are each independently a $C_1$-$C_{20}$ monovalent hydrocarbon group or alkoxy group. $R^{33}$ and $R^{34}$ are preferably $C_1$-$C_4$ alkyl or alkoxy groups, more preferably $C_1$-$C_2$ alkyl or alkoxy groups. Preferred illustrative examples include methyl, ethyl, propyl, tert-butyl, methoxy and ethoxy. The subscripts y and z are each independently an integer of 0 to 2.

In formula (5), $k^1$, $k^2$, $k^3$, $k^4$, and $k^5$, indicative of compositional ratios of corresponding recurring units, are positive numbers in the range: $0<k^1<1$, $0<k^2<1$, $0\le k^3<1$, $0\le k^4<1$, $0<k^5<1$, $0.67\le(k^2+k^4)/(k^1+k^3+k^5)\le1.67$, and $k^1+k^2+k^3+k^4+k^5=1$; and h is an integer of 0 to 300.

(B) Epoxy Additive

The epoxy additive as component (B) is a compound containing 1 to 8 epoxy groups per molecule, containing at least one element selected from nitrogen, sulfur and phosphorus, and having a molecular weight of 50 to 6,000. Since the epoxy additive has epoxy groups which react with phenolic hydroxyl groups in the composition, it is fixed as a cured product. In addition, the epoxy additive contains nitrogen, sulfur and/or phosphorus atoms, which interact with copper to enhance the bonding force at the copper interface.

Preferred examples of the epoxy additive include the following compounds.

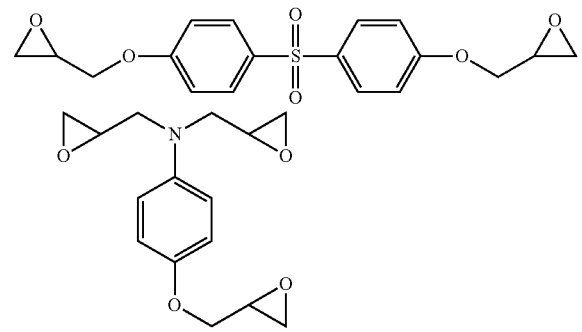

Also preferably, a compound having the formula (9) may be used as the epoxy additive.

In formula (9), m is an integer of 1 to 3. $X^A$ is a monovalent organic group having at least one epoxy group. $X^B$ is a group containing at least one element selected from nitrogen, sulfur and phosphorus. Although the structures of $X^A$ and $X^B$ are not critical, it is essential that the epoxy additive have a molecular weight of 50 to 6,000. If the molecular weight is less than the range, a compound will evaporate off before cure, failing to gain a bonding force improving effect. If the molecular weight is more than the range, a compound may become incompatible, failing to gain a bonding force improving effect or leading to a drop of cured strength.

Examples of $X^A$ are shown below.

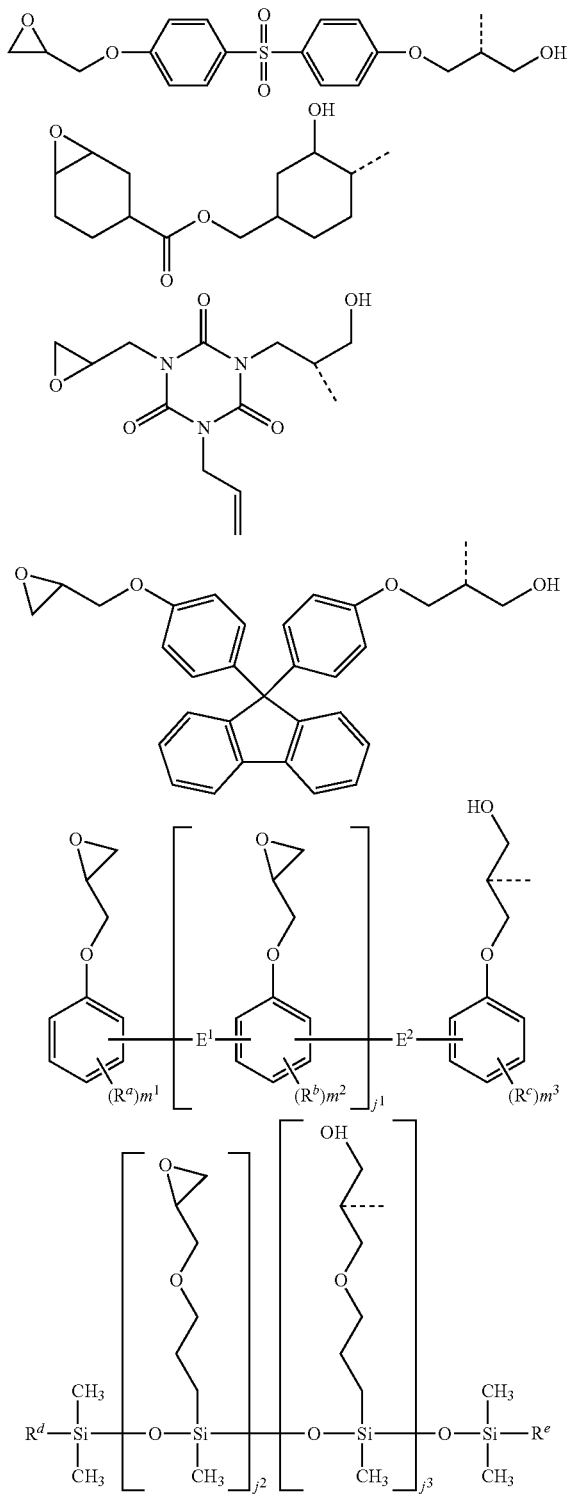

Herein, the broken line denotes a valence bond to $X^B$. $R^a$ to $R^e$ are each independently a $C_1$-$C_6$ monovalent hydrocarbon group. $E^1$ and $E^2$ are each independently a $C_1$-$C_{12}$ divalent hydrocarbon group. The subscripts $m^1$, $m^2$ and $m^3$ are each independently an integer of 0 to 3, $j^1$ is an integer of 0 to 7, $j^2$ is an integer of 1 to 8, and $j^3$ is an integer of 1 to 3.

Examples of $X^B$ are shown below.

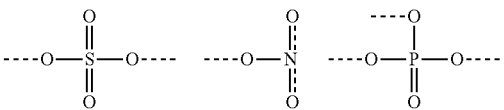

In formula (9), when m is 2 or 3, groups $X^A$ may be the same or different.

The compound having formula (9) may be readily prepared by reacting a compound having at least two epoxy groups with nitric acid, sulfuric acid or phosphoric acid. For example, the desired compound may be obtained by dissolving the compound having at least two epoxy groups in a solvent in a reactor, dropwise adding the acid thereto, stirring the mixture for 2 hours, and distilling the reaction mixture.

The epoxy additive is preferably added in an amount of 0.1 to 18 parts by weight, more preferably 0.5 to 15 parts by weight, even more preferably 1.0 to 10 parts by weight per 100 parts by weight of the resin as component (A). Outside the range, a less amount of the epoxy additive may be insufficient in the bonding force improving effect whereas a larger amount may lead to a lowering of photosensitivity, cure inhibition, and a lowering of device reliability.

Other Components

In necessary, the inventive composition may further include (C) a crosslinker, (D) a photoacid generator, (E) an organic solvent, (F) a polyfunctional epoxy compound, exclusive of the compound as component (B), or the like.

(C) Crosslinker

The crosslinker undergoes crosslinking reaction with component (A) to facilitate pattern formation and to increase the strength of a resin coating.

The crosslinker is preferably selected from nitrogen-containing compounds, such as melamine, guanamine, glycoluril and urea compounds, containing on the average at least two methylol and/or alkoxymethyl groups per molecule, and condensates thereof, and phenol compounds having on the average at least two methylol or alkoxymethyl groups per molecule, but not limited thereto.

Suitable melamine compounds include those having the formula (10).

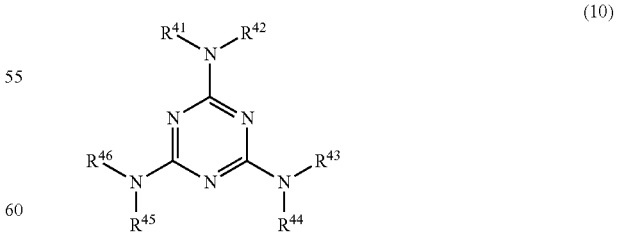

(10)

In formula (10), $R^{41}$ to $R^{46}$ are each independently a methylol, $C_2$-$C_5$ alkoxymethyl group or hydrogen, and at least two of $R^{41}$ to $R^{46}$ are methylol or alkoxymethyl. Suitable alkoxymethyl groups include methoxymethyl and ethoxymethyl.

Suitable melamine compounds include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

Suitable guanamine compounds include tetramethylolguanamine, tetramethoxymethylguanamine, and tetramethoxyethylguanamine.

Suitable glycoluril compounds include tetramethylolglycoluril and tetrakis(methoxymethyl)glycoluril.

Suitable urea compounds include tetramethylolurea, tetramethoxymethylurea, tetramethoxyethylurea, tetraethoxymethylurea, and tetrapropoxymethylurea.

The condensates of the nitrogen-containing compounds include condensates of the nitrogen-containing compounds with formaldehyde, preferably condensates of melamine compounds or urea compounds. The condensates of the nitrogen-containing compounds may be prepared by any prior art well-known methods.

Examples of the phenol compound having on the average at least two methylol or alkoxymethyl groups per molecule include (2-hydroxy-5-methyl)-1,3-benzenedimethanol and 2,2',6,6'-tetramethoxymethylbisphenol A.

The crosslinker (C) is preferably used in an amount of 0.5 to 50 parts, and more preferably 1 to 30 parts by weight per 100 parts by weight of component (A). An amount of the crosslinker in the range ensures that the composition is effectively photo-curable and advantageously used as resist material. The crosslinker may be used alone or in admixture.

(D) Photoacid Generator

The photoacid generator (PAG) is not particularly limited as long as it is decomposed to generate an acid upon exposure to light, preferably light of wavelength 240 to 500 nm.

The generated acid serves as a curing catalyst. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Suitable onium salts include sulfonium salts having the following formula (11) and iodonium salts having the following formula (12).

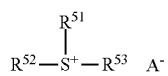

(11)

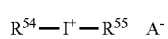

(12)

In formulae (11) and (12), $R^{51}$ to $R^{55}$ are each independently a $C_1$-$C_{12}$ alkyl group, $C_6$-$C_{12}$ aryl group, or $C_7$-$C_{12}$ aralkyl group, which may have a substituent. $A^-$ is a non-nucleophilic counter ion.

The alkyl group may be straight, branched or cyclic. Examples include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl, and adamantyl. Exemplary aryl groups include phenyl, naphthyl and biphenylyl. Exemplary aralkyl groups include benzyl and phenethyl. Examples of the substituent include oxo, straight, branched or cyclic $C_1$-$C_{12}$ alkoxy groups, straight, branched or cyclic $C_1$-$C_{12}$ alkyl groups, $C_6$-$C_{24}$ aryl groups, $C_7$-$C_{25}$ aralkyl groups, $C_6$-$C_{24}$ aryloxy groups, and $C_6$-$C_{24}$ arylthio groups.

Preferably, $R^{51}$ to $R^{55}$ are selected from optionally substituted alkyl groups such as methyl, ethyl, propyl, butyl, cyclohexyl, norbornyl, adamantyl, 2-oxocyclohexyl; optionally substituted aryl groups such as phenyl, naphthyl, biphenylyl, 2-, 3- or 4-methoxyphenyl, ethoxyphenyl, 3- or 4-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Inter alia, optionally substituted aryl groups and optionally substituted aralkyl groups are more preferred.

Examples of the non-nucleophilic counter ion represented by $A^-$ include halide ions such as chloride and bromide; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; and hexafluorophosphate ions and fluorinated alkylfluorophosphate ions.

Exemplary diazomethane derivatives are compounds of the following formula (13).

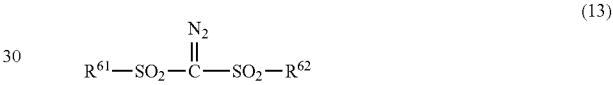

(13)

In formula (13), $R^{61}$ and $R^{62}$ are each independently a $C_1$-$C_{12}$ alkyl or haloalkyl group, optionally substituted $C_6$-$C_{12}$ aryl group, or optionally substituted $C_7$-$C_{12}$ aralkyl group.

Examples of the alkyl group are as exemplified above for $R^{51}$ to $R^{55}$. Exemplary haloalkyl groups include trifluoromethyl, 1,1,1-trifluoroethyl, 1,1,1-trichloroethyl, and nonafluorobutyl.

Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Examples of the optionally substituted aralkyl group include benzyl and phenethyl.

Exemplary glyoxime derivatives are compounds of the following formula (14).

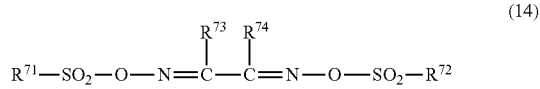

(14)

In formula (14), $R^{71}$ to $R^{74}$ are each independently a $C_1$-$C_{12}$ alkyl or haloalkyl group, optionally substituted $C_6$-$C_{12}$ aryl group, or optionally substituted $C_7$-$C_{12}$ aralkyl group. $R^{73}$ and $R^{74}$ may bond together to form a ring with the carbon atom to which they are attached, and in this case, a combination of $R^{73}$ and $R^{74}$ is a $C_1$-$C_{12}$ straight or branched alkanediyl group.

Examples of the alkyl group, haloalkyl group, optionally substituted aryl group, and optionally substituted aralkyl group are as exemplified above for $R^{61}$ and $R^{62}$. Suitable straight or branched alkanediyl groups include methylene, ethanediyl, propanediyl, butanediyl and hexanediyl.

Exemplary onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, [4-(4-biphenylylthio)phenyl]-4-biphenylylphenylsulfonium tris(trifluoromethane-sulfonyl)methide, triphenylsulfonium tetrakis(fluorophenyl)borate, tris [4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis(pentafluorophenyl)borate.

Exemplary diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Exemplary glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Exemplary β-ketosulfone derivatives include 2-cyclohexylcarbonyl-2-(p-toluenesulfonyl)propane and 2-isopropylcarbonyl-2-(p-toluenesulfonyl)propane.

Exemplary disulfone derivatives include diphenyl disulfone and dicyclohexyl disulfone.

Exemplary nitrobenzyl sulfonate derivatives include 2,6-dinitrobenzyl p-toluenesulfonate and 2,4-dinitrobenzyl p-toluenesulfonate.

Exemplary sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Exemplary imido-yl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and N-trifluoromethylsulfonyloxynaphthylimide.

Typical of the oxime sulfonate derivative is α-(benzenesulfoniumoxyimino)-4-methylphenylacetonitrile.

Suitable iminosulfonate derivatives include (5-(4-methylphenyl)sulfonyloxyimino-5H-thiophen-2-ylidene)-(2-methylphenyl)-acetonitrile and (5-(4-(4-methylphenylsulfonyloxy)phenylsulfonyloxyimino)-5H-thiophen-2-ylidene)-(2-methylphenyl)acetonitrile.

Examples of the triazine derivative include 2-(methoxyphenyl)-4,6-bis(trichloromethyl)-s-triazine, 2-[2-(3,4-dimethoxyphenyl)ethenyl]-4,6-bis(trichloromethyl)-s-triazine, 2-[2-(furan-2-yl)ethenyl]-4,6-bis(trichloromethyl)-s-triazine, and 2-[2-(5-methylfuran-2-yl)ethenyl]-4,6-bis(trichloromethyl)-s-triazine.

As the PAG, the above-exemplified onium salts are preferred, and the above-exemplified sulfonium salts are more preferred.

The PAG (B) is preferably used in an amount of 0.05 to 20 parts by weight, and more preferably 0.2 to 5 parts by weight per 100 parts by weight of component (A). As long as the amount of the PAG is in the range, sufficient photocure is available and cure in thick film form is satisfactory. The PAGs may be used alone or in admixture of two or more.

(E) Organic Solvent

The organic solvents in which the foregoing compounds are dissolvable or dispersible are preferable. Examples of the organic solvent include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; and amides such as N-methyl-2-pyrrolidone and N,N-dimethylacetamide.

Of these solvents, PGMEA, PGME, ethyl lactate, cyclohexanone, cyclopentanone, methyl isobutyl ketone, γ-butyrolactone, and mixtures thereof are preferred, because the PAG is most soluble therein.

The organic solvent is preferably used in an amount of 20 to 90% by weight, more preferably 30 to 65% by weight based on the composition. As long as the amount of the organic solvent is in the range, the compounds are compatible and the composition is readily coatable. The organic solvents may be used alone or in admixture.

(F) Polyfunctional Epoxy Compound

The polyfunctional epoxy compound (exclusive of the compound as component (B)) undergoes crosslinking reaction with component (A) upon heat curing of a resin coating after patterning, contributing to the reliability of the coating and the adhesion of the coating to the substrate.

Examples of the polyfunctional epoxy compound include glycidyl ether forms of phenols, alicyclic epoxy compounds having a cyclohexene oxide group, and those compounds obtained by introducing an epoxy compound having an unsaturated bond into an organosiloxane having a hydrosilyl group through hydrosilylation reaction.

In the glycidyl ether forms of phenols, the phenol structure may be of novolak, bisphenol, biphenyl, phenolaralkyl, dicyclopentadiene, naphthalene, or amino-containing type. Suitable glycidyl ether forms of phenols include glycidyl ethers of bisphenol A, AD, and F type, glycidyl ethers of hydrogenated bisphenol A, glycidyl ethers of ethylene oxide adduct bisphenol A, glycidyl ethers of propylene oxide adduct bisphenol A, glycidyl ethers of phenol novolak resins, glycidyl ethers of cresol novolak resins, glycidyl ethers of naphthalene resins, glycidyl ethers of dicyclopentadiene phenol resins, and trifunctional epoxy forms of aminophenol.

The alicyclic epoxy compounds having a cyclohexene oxide group include tetra(3,4-epoxycyclohexylmethyl)-modified ε-caprolactone butanetetracarboxylate as well as the compound shown below.

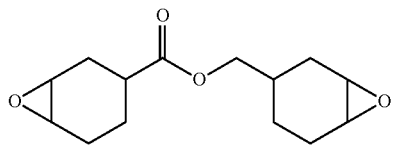 [SMILES: O=C(OCC1CCC2OC2C1)C1CCC2OC2C1]

The compounds obtained by introducing an epoxy compound having an unsaturated bond into an organosiloxane having a hydrosilyl group through hydrosilylation reaction include the reaction product obtained by reacting an epoxy compound having an unsaturated bond such as allyl glycidyl ether or vinyl cyclohexyl epoxide with an organosiloxane having a hydrosilyl group.

Illustrative examples of such compounds include epoxy-containing organopolysiloxanes having the formula (15), epoxy-containing cyclosiloxanes having the formula (16), and bissilyl-substituted compounds having the formula (17).

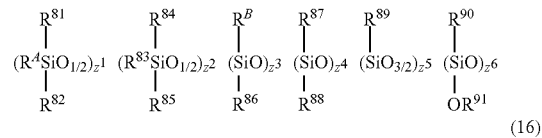

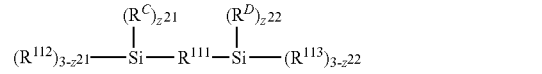

In formulae (15) to (17), $R^A$ to $R^D$ are each independently an epoxy-containing organic group. Preferred examples of the epoxy-containing organic group include, but are not limited to, epoxy-containing alkyl groups such as glycidoxypropyl and cyclohexylepoxyethyl. Of these, glycidoxypropyl is most preferred as $R^A$ to $R^D$.

In formulae (15) to (17), $R^{81}$ to $R^{90}$, $R^{101}$ to $R^{103}$, $R^{112}$ and $R^{113}$ are each independently a $C_1$-$C_8$ monovalent hydrocarbon group. Suitable monovalent hydrocarbon groups are as exemplified above for $R^1$ to $R^6$ in formula (2).

In formula (15), $R^{91}$ is hydrogen or a $C_1$-$C_8$ alkyl group. Suitable alkyl groups include methyl, ethyl, propyl, butyl, pentyl, hexyl, and octyl.

In formula (15), z to $z^6$ are integers in the range: $0 \leq z^1 \leq 10$, $0 \leq z^2 \leq 10$, $0 \leq z^3 \leq 30$, $0 \leq z^4 \leq 100$, $0 \leq z^5 \leq 10$, $0 \leq z^6 \leq 20$, $z^1+z^3 \geq 2$, $0.1 \leq (z^1+z^3)/(z^1+z^2+z^3+z^4) \leq 1$, and $0 \leq (z^5+Z^6)/(z^1+z^2+z^3+z^4+z^5+z^6) \leq 0.05$.

In formula (16), $z^{11}$ and $z^{12}$ are integers in the range: $2 \leq z^{11} \leq 10$, $0 \leq z^{12} \leq 20$, and $0.2 \leq z^{11}/(z^{11}+z^{12}) \leq 1$.

In formula (17), $R^{111}$ is a $C_2$-$C_{24}$ divalent organic group. The divalent organic group may be straight, branched or cyclic. Examples include alkanediyl groups such as ethanediyl, propanediyl and hexanediyl, cycloalkanediyl groups such as cyclopentanediyl and cyclohexanediyl, divalent aromatic groups such as phenylene and biphenyldiyl, and groups obtained by combining plural such groups.

In formula (17), $z^{21}$ and $z^{22}$ are each independently an integer of 1 to 3.

Examples of the epoxy-containing organopolysiloxane having formula (15) are shown below, but not limited thereto.

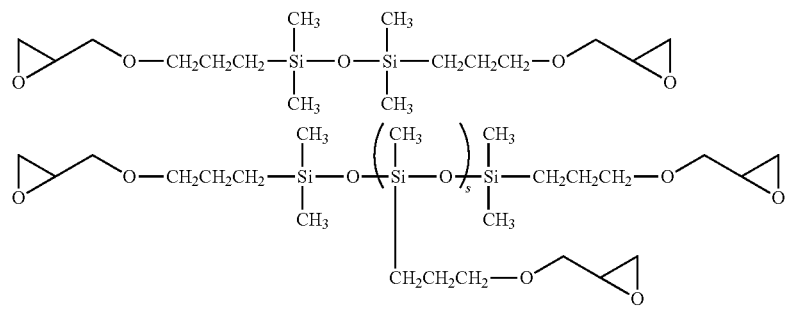

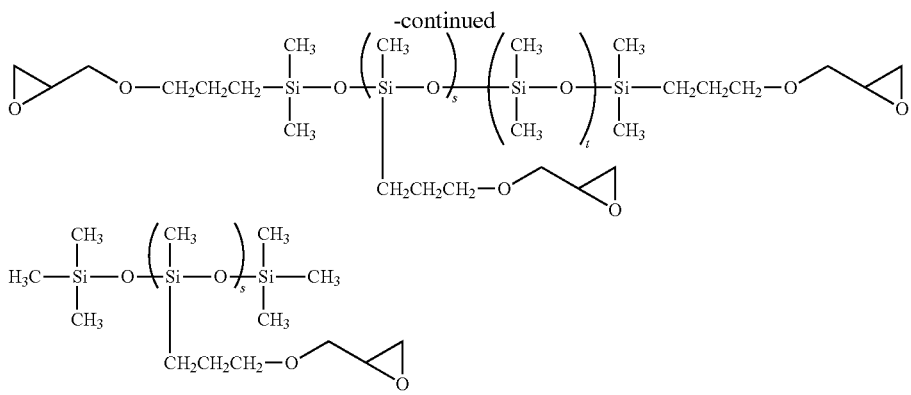

Herein s is preferably an integer of 1 to 10, and t is preferably an integer of 1 to 5.

Examples of the epoxy-containing cyclosiloxane having formula (16) are shown below, but not limited thereto.

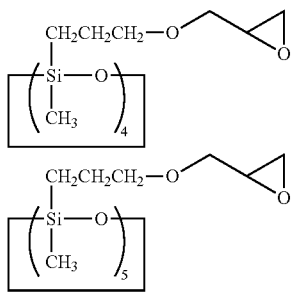

Examples of the bissilyl-substituted compound having formula (17) are shown below, but not limited thereto.

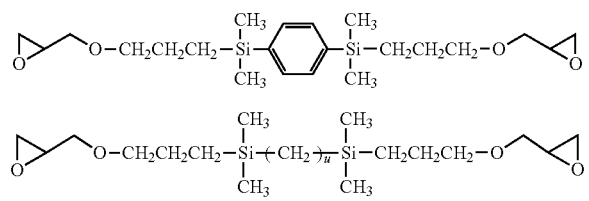

Herein u is an integer of 2 to 24.

An appropriate amount of the polyfunctional epoxy compound used is 0.05 to 100 parts, more preferably 0.1 to 50 parts, even more preferably 1 to 30 parts by weight per 100 parts by weight of component (A). As long as the amount of the polyfunctional epoxy compound is in the range, the composition cures into a film having improved toughness and substrate adhesion. The polyfunctional epoxy compounds may be used alone or in admixture.

The photosensitive resin composition of the invention is advantageously used, for example, as wiring protective film and interlayer dielectric film in semiconductor devices, and photoresist material for microfabrication.

Photosensitive Dry Film

Another embodiment of the invention is a photosensitive dry film comprising a photosensitive resin coating which is obtained by processing the photosensitive resin composition into a film form. Since a film form of the photosensitive resin composition is used, a pattern is obtainable without the need for solvents, which is advantageous from the aspect of working environment. Even when the photosensitive dry film is used, there is obtained a pattern of equivalent quality to the use of a solution form of the photosensitive resin composition.

The photosensitive dry film may further include a protective film stacked on the photosensitive resin coating of the photosensitive resin composition. Described below is one exemplary method of manufacturing a photosensitive dry film in this embodiment.

The dry film is manufactured by mixing necessary components to form a photosensitive resin composition solution, and applying the solution onto a protective film to a desired thickness by means of a reverse roll coater, comma coater or the like. The protective film coated with the resin composition solution is passed through an in-line dryer where it is dried by heating at 30 to 160° C. for 2 to 20 minutes to remove the organic solvent. Next, the coated protective film is pressure bonded or laminated to another protective film by means of a roll laminator, yielding a laminate having a resin film between protective films.

When the photosensitive resin composition is preformed into a film form, the thickness is not particularly limited. The thickness of a resin film is preferably 1 to 120 μm, more preferably 2 to 100 μm, even more preferably 3 to 85 μm. Within the range, a resin film having minimal thickness variation and ease of patterning is available.

The protective film is not particularly limited as long as it is strippable or releasable from a resin film of the inventive resin composition without deforming the shape thereof. The protective film generally functions as a protective or release film for wafers, and includes plastic films such as polyethylene (PE) film, polypropylene (PP) film, polymethylpentene (TPX) film, and polyester film having undergone release treatment. A stripping or release force of 50 to 300 mN/min is preferred. The protective film preferably has a thickness of 25 to 150 μm, more preferably 38 to 125 μm.

Using the photosensitive dry film, a wafer may be encapsulated or sealed. The encapsulation method, which is not particularly limited, includes the steps of stripping one protective layer from the resin film, setting the vacuum chamber of a vacuum laminator (e.g., TEAM-300 by Takatori Corp.) at a vacuum of 50 to 1,000 Pa, preferably 50 to 500 Pa, typically 100 Pa, tightly bonding the resin film having the other protective layer to a wafer at a temperature of 30 to 130° C., preferably 50 to 120° C., typically 100° C., resuming atmospheric pressure, cooling the wafer to room temperature, taking out the wafer from the laminator, and stripping the other protective layer.

Pattern Forming Process

A further embodiment of the invention is a pattern forming process using the photosensitive resin composition defined above, the process comprising the steps of (i) forming a photosensitive resin coating of the photosensitive resin composition on a substrate, (ii) exposing the photosensitive resin coating to radiation, and (iii) developing the exposed resin coating in a developer.

In step (i), a photosensitive resin coating is formed on a substrate using the photosensitive resin composition. Examples of the substrate used herein include silicon, glass and quartz wafers, silicon nitride substrates, silicon oxide substrates, plastic substrates such as paper phenol, glass-reinforced epoxy, and polyimide substrates, ceramic based circuit boards, and substrates having a resin film on their surface. On these substrates, a metal film may be deposited, a wiring pattern may be printed, or a photosensitive resin coating of the same or different type may be formed.

One method of forming the photosensitive resin coating is by coating a solution of the photosensitive resin composition in an organic solvent by any technique such as dipping, spin coating or roll coating. The coating weight may be selected as appropriate for a particular purpose, preferably so as to form a photosensitive resin coating having a thickness of 0.1 to 300 μm.

An alternative method of forming the photosensitive resin coating is by attaching the photosensitive dry film to the substrate. To this end, a vacuum diaphragm laminator (trade name V-130 by Nikko Material Co., Ltd.) may be used under conditions: lamination temperature 30 to 130° C., vacuum 50 to 500 Pa, pressure 0.1 to 0.9 MPa, and lamination time 15 to 300 seconds.

Once the photosensitive resin coating is formed on the substrate, the coating may be prebaked to volatilize off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation, preferably of wavelength 240 to 500 nm, for curing. Exposure may be made through a photomask. The photomask may be, for example, one perforated with a desired pattern. Although the material of the photomask is not particularly limited, a material capable of shielding radiation in the above wavelength range is preferred. Typically a mask having a light-shielding film of chromium is used, though not limited thereto.

Examples of the radiation of wavelength 240 to 500 nm include radiation of various wavelengths from radiation-emitting units, specifically UV radiation such as g-line or i-line, and deep UV (248 nm). An appropriate exposure dose is 10 to 5,000 mJ/cm$^2$. The next step may be post-exposure bake (PEB) which is effective for enhancing development sensitivity. PEB may be performed at 40 to 150° C. for 0.5 to 10 minutes, for example.

The exposure or PEB is followed by the step (iii) of developing the exposed resin coating in a developer. Preferred examples of the developer include organic solvents used as the solvent, such as dimethylacetamide and cyclohexanone, and basic aqueous solutions such as aqueous solutions of tetramethylammonium hydroxide (TMAH) and sodium carbonate. Development is effected in a conventional manner, for example, by dipping the exposed coating in the developer. The development is followed by washing, rinsing and drying if necessary. In this way, a resin coating having the desired pattern is obtained. Although the pattern forming process has been described, it is sometimes unnecessary to form a pattern. When it is simply desired to form a uniform film, for example, the same process as above may be followed except that the photomask is not used.

After the development step, the patterned coating may be heated in an oven or hot plate at a temperature of 70 to 380° C., preferably 80 to 300° C. for about 10 minutes to about 10 hours, for thereby increasing the crosslinking density and removing any residual volatile matter. As a result, there is obtained a cured resin coating having an improved bonding force to the substrate, heat resistance, mechanical strength, and good electric properties.

The thus obtained cured coating has augmented adhesion to substrates, copper wirings and resist film. Since hygroscopic properties remain unchanged, the cured coating passes the migration test and eliminates the risk of precipitation because it is incorporated in the cured system. Owing to these properties, the cured coating is best suited as a material for electronic devices.

EXAMPLES

Examples of the invention are given below by way of illustration and not by way of limitation. Notably, the weight average molecular weight (Mw) is measured by GPC versus polystyrene standards using tetrahydrofuran (THF) solvent. The composition of a resin is analyzed by $^1$H-NMR spectroscopy.

The compounds (S-1) to (S-6) and (R-1) to (R-7) used in Examples are shown below.

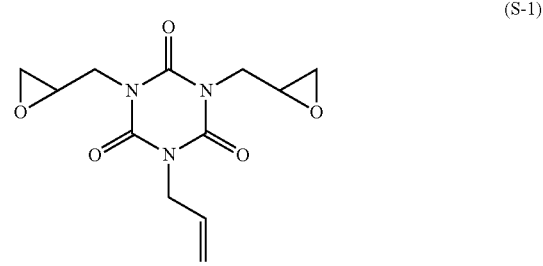
(S-1)

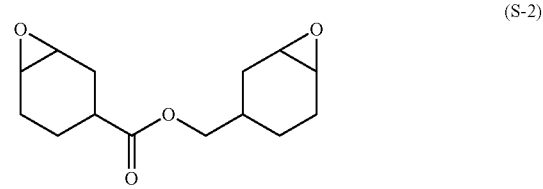
(S-2)

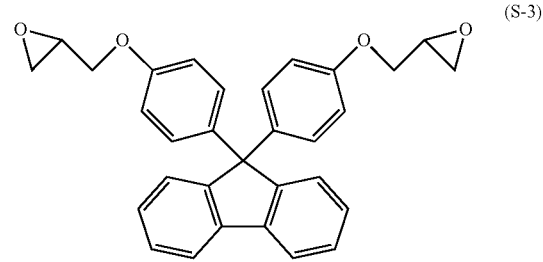
(S-3)

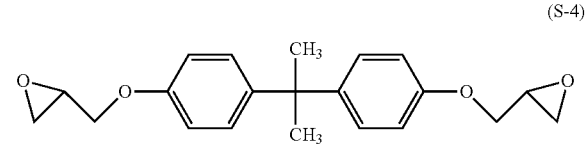
(S-4)

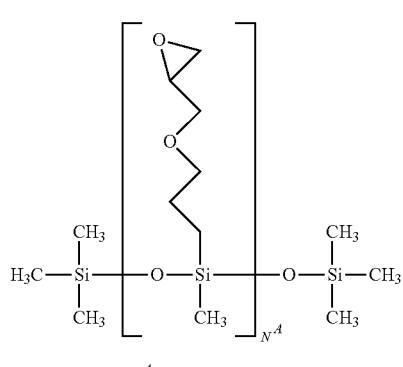

(S-5)

$N^A$ = 1.8 on average

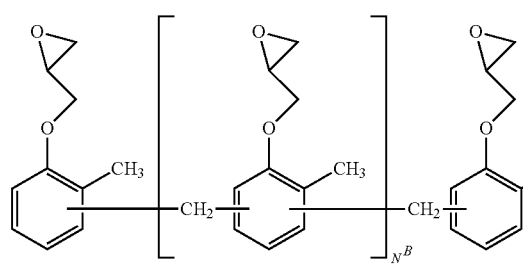

(S-6)

$N^B$ = 4.2 on average

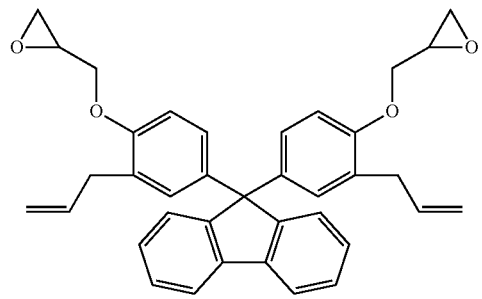

(R-1)

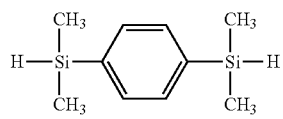

(R-2)

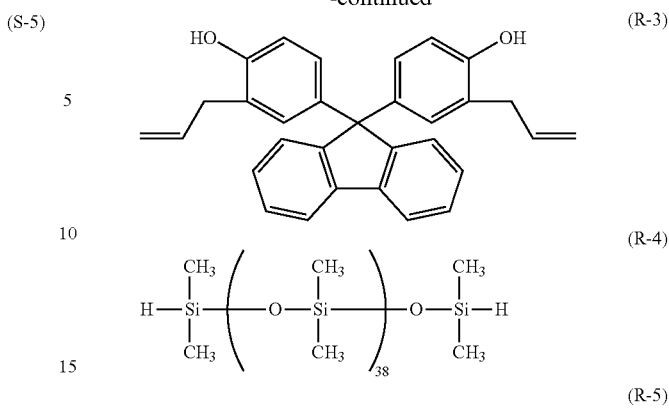

(R-3)

(R-4)

(R-5)

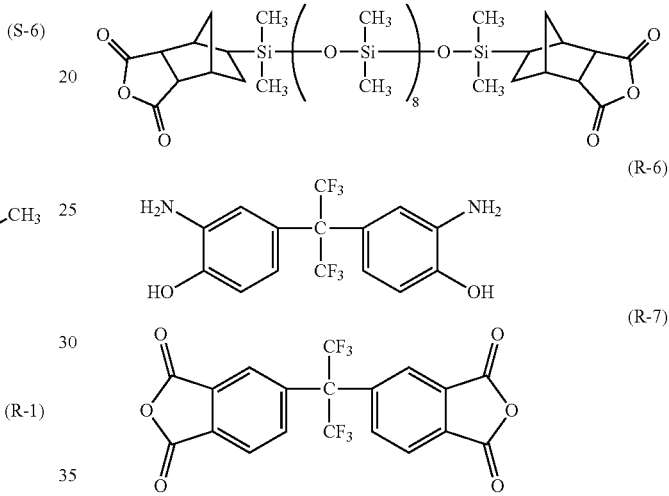

(R-6)

(R-7)

Examples 1 to 6

A 5-L separable flask equipped with a reflux condenser, thermometer, and dropping funnel was charged with 2,000 g of toluene, and the amount shown in Table 1 of each of compounds (S-1) to (S-6) as the reactant. Then, the amount shown in Table 1 of nitric acid, sulfuric acid or phosphoric acid was added dropwise over 2 hours from the dropping funnel to the flask. After the dropwise addition, the solution was heated at 80° C. and held for 2 hours. Finally the solvent and unreacted compound were removed from the reaction solution by vacuum distillation, obtaining compounds (G-1) to (G-6) as the epoxy additive.

TABLE 1

| | Reactant | | Acid | | Compound produced | |
|---|---|---|---|---|---|---|
| | Type | Amount | Type | Amount | Type | Amount |
| Example 1 | S-1 | 309 g (1.1 mol) | nitric acid | 63 g (1.0 mol) | G-1 | 248 g (0.72 mol) |
| Example 2 | S-2 | 555 g (2.2 mol) | sulfuric acid | 98 g (1.0 mol) | G-2 | 398 g (0.66 mol) |
| Example 3 | S-3 | 1,525 g (3.3 mol) | phosphoric acid | 98 g (1.0 mol) | G-3 | 1,262 g (0.85 mol) |
| Example 4 | S-4 | 1,194 g (1.1 mol) | nitric acid | 63 g (1.0 mol) | G-4 | 964 g (0.84 mol) |
| Example 5 | S-5 | 757 g (2.2 mol) | sulfuric acid | 98 g (1.0 mol) | G-5 | 613 g (0.78 mol) |
| Example 6 | S-6 | 1,569 g (3.3 mol) | phosphoric acid | 98 g (1.0 mol) | G-6 | 1,372 g (0.90 mol) |

The compounds (G-1) to (G-6) have the following structure.

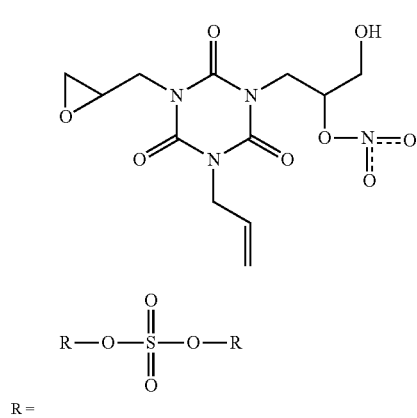
(G-1)

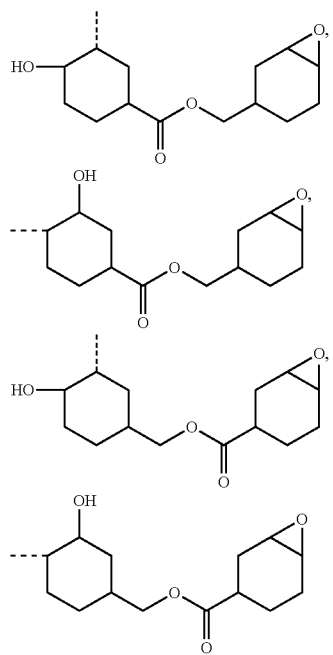
(G-2)

Herein, the broken line designates a valence bond to an oxygen atom.

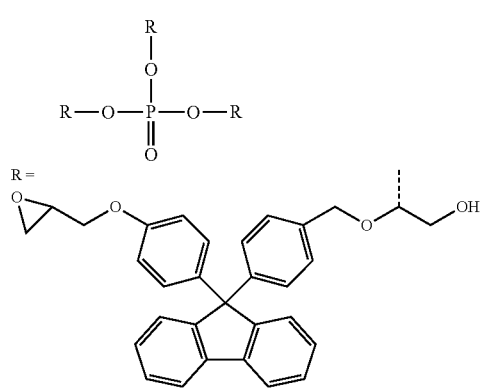
(G-3)

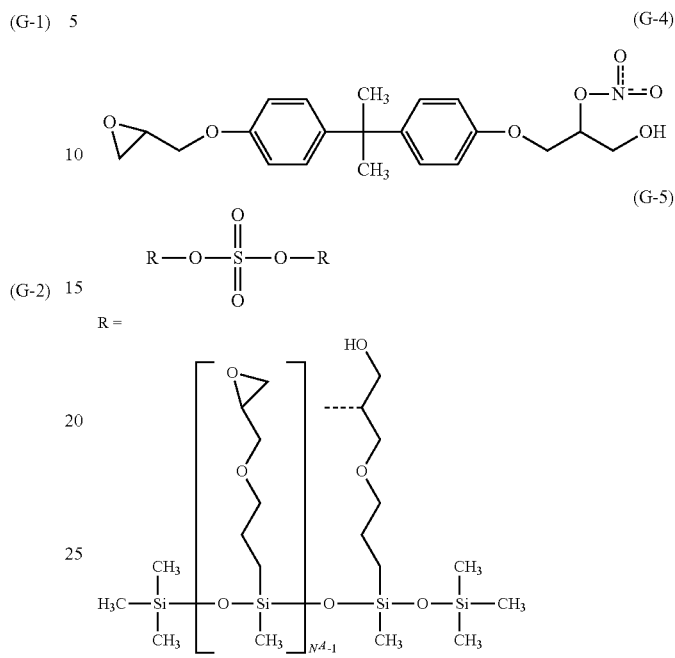
(G-4)
(G-5)

Herein, $N^A$ is as defined above, and the broken line designates a valence bond to an oxygen atom.

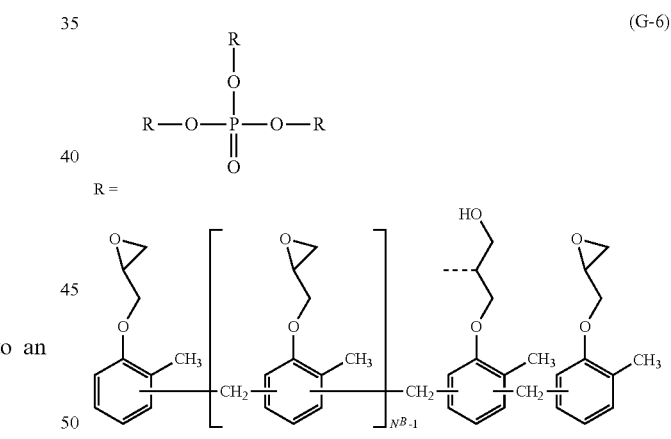
(G-6)

Herein, $N^B$ is as defined above, and the broken line designates a valence bond to an oxygen atom.

Resin Synthesis Example 1

A 3-L flask equipped with a stirrer, thermometer, nitrogen purge line and reflux condenser was charged with 271.1 g (0.50 mol) of compound (R-1), 215.1 g (0.50 mol) of compound (R-3), and 1,500 g of toluene and heated at 70° C. Thereafter, 1.0 g of a toluene solution of chloroplatinic acid (platinum concentration 0.5 wt %) was added, and 194.1 g (1.00 mol) of compound (R-2) was added dropwise over 1 hour. At the end of dropwise addition, the reaction solution was heated at 100° C. and aged for 6 hours. Toluene was distilled off in vacuum from the reaction solution, yielding 590 g of Resin 1. Resin 1 had a Mw of 38,800.

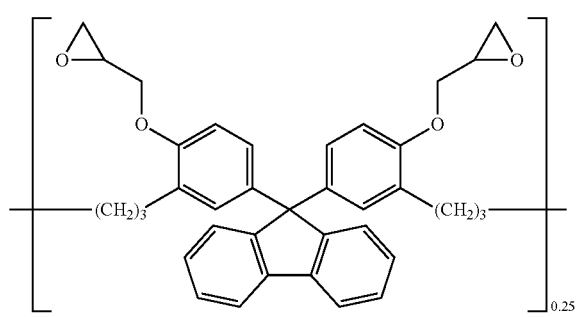

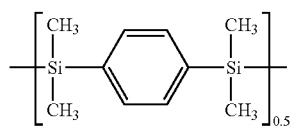

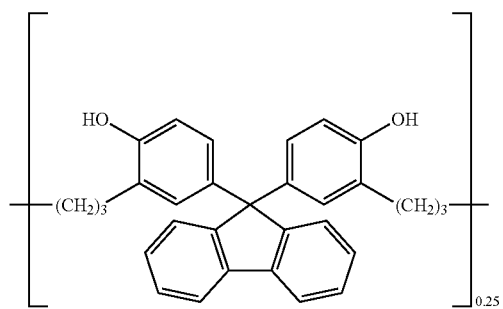

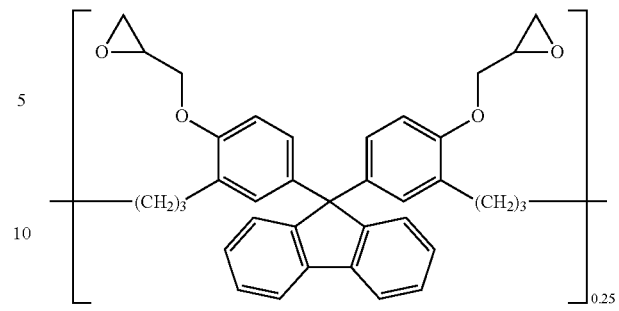

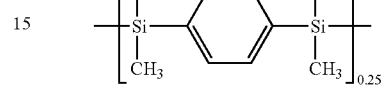

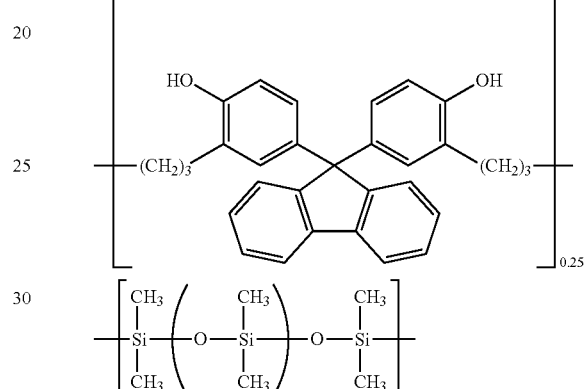

Resin Synthesis Example 2

A 3-L flask equipped with a stirrer, thermometer, nitrogen purge line and reflux condenser was charged with 81.3 g (0.15 mol) of compound (R-1), 64.5 g (0.15 mol) of compound (R-3), and 1,500 g of toluene and heated at 70° C. Thereafter, 1.0 g of a toluene solution of chloroplatinic acid (platinum concentration 0.5 wt %) was added, and 29.1 g (0.15 mol) of compound (R-2) and 442.0 g (0.15 mol) of compound (R-4) were added dropwise each over 1 hour. At the end of dropwise addition, the reaction solution was heated at 100° C. and aged for 6 hours. Toluene was distilled off in vacuum from the reaction solution, yielding 2,570 g of Resin 2. Resin 2 had a Mw of 40,400.

Resin Synthesis Example 3

A flask equipped with a stirrer, thermometer, and nitrogen purge line was charged with 264.0 g (0.25 mol) of compound (R-5), 183.1 g (0.50 mol) of compound (R-6), and 1,400 g of γ-butyrolactone. Then 111.1 g (0.25 mol) of compound (R-7) was added to the flask in such a controlled manner that the temperature of the reaction system might not exceed 50° C. Thereafter, 2.2 g (0.02 mol) of p-aminophenol was added to the solution, which was stirred at room temperature for 10 hours. The flask was equipped with a reflux condenser having a water adaptor, and 250 g of xylene was added. The solution was heated at 170° C. and held at the temperature for 6 hours, obtaining a brown solution. Then 60.2 g (0.80 mol) of glycidol was added to the solution which was heated at 110° C. for 3 hours. At the end of reaction, the reaction solution was cooled to room temperature and poured into methanol. The resulting precipitate was filtered and dried, yielding Resin 3. Resin 3 had a Mw of 36,700.

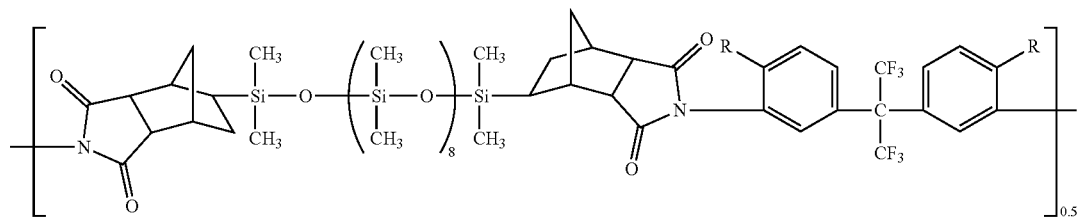

-continued

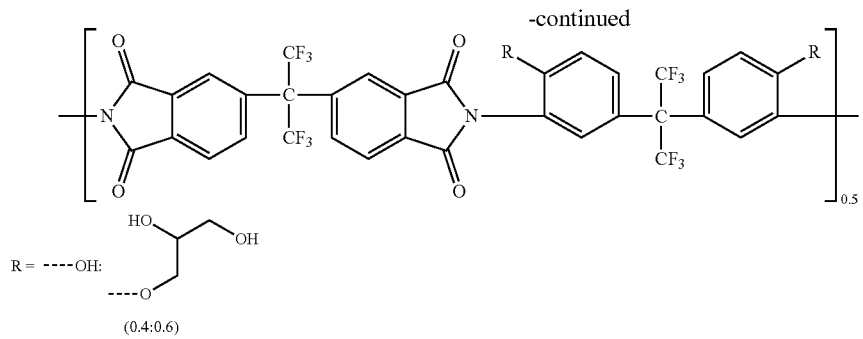

R = ----OH;
(0.4:0.6)

Pattern Forming Test

A resin solution was prepared by combining components in accordance with the formulation shown in Tables 2, 3 and 4, stirring and mixing them. The resin solution was spin coated onto a silicon wafer to form a resin layer of 10 μm thick.

In Examples 1 to 9, 13 to 20 and Comparative Examples 1 to 11, the resin layer was heated on a hotplate at 90° C. for 2 minutes to volatilize off the solvent, exposed to radiation of wavelength 365 nm through a mask having a 20-μm via pattern, baked (PEB) on a hotplate at 90° C. for 4 minutes, developed 4 times in a 2.38 wt % TMAH aqueous solution as the developer for 60 seconds, and heated at 200° C. for 2 hours for curing.

In Examples 10 to 12 using polyimide PIMEL, the resin layer was exposed to radiation of wavelength 365 nm through a mask having a 20-μm via pattern, developed 4 times in a 2.38 wt % TMAH aqueous solution as the developer for 60 seconds, and heated at 350° C. for 2 hours for curing.

A cross section of the pattern was observed under SEM. A sample was rated "OK" when the resin was removed to the bottom and "NG" when any resin residues were found at the bottom.

Die Shear Test

The resin solution prepared as above was spin coated onto a silicon wafer having copper evaporated thereon to form a resin layer of 10 μm thick.

In Examples 1 to 9, 13 to 20 and Comparative Examples 1 to 11, the resin layer was heated on a hotplate at 90° C. for 2 minutes to volatilize off the solvent, exposed to radiation of wavelength 365 nm through a mask having a 100-μm square post pattern, baked (PEB) on a hotplate at 90° C. for 4 minutes, developed 4 times in a 2.38 wt % TMAH aqueous solution as the developer for 60 seconds, and heated at 200° C. for 2 hours for curing.

In Examples 10 to 12 using polyimide PIMEL, the resin layer was exposed to radiation of wavelength 365 nm through a mask having a 100-μm square post pattern, developed 4 times in a 2.38 wt % TMAH aqueous solution as the developer for 60 seconds, and heated at 350° C. for 2 hours for curing.

The resulting 100-μm square post pattern was examined by a die shear test using a bonding force measuring system (versatile bond tester series 4000, DS-100 by Nordson Advanced Technology. A bonding force when the post pattern was laterally flipped was measured.

Migration Test

The resin solution prepared as above was spin coated onto a SiN wafer having comb-shaped copper wiring thereon to form a resin layer of 10 μm thick.

In Examples 1 to 9, 13 to 20 and Comparative Examples 1 to 11, the resin layer was heated on a hotplate at 90° C. for 2 minutes to volatilize off the solvent, flood exposed to radiation of wavelength 365 nm without using a mask, baked (PEB) on a hotplate at 90° C. for 4 minutes, developed 4 times in a 2.38 wt % TMAH aqueous solution as the developer for 60 seconds, and heated at 200° C. for 2 hours for curing.

In Examples 10 to 12 using polyimide PIMEL, the resin layer was exposed to radiation of wavelength 365 nm without using a mask, developed 4 times in a 2.38 wt % TMAH aqueous solution as the developer for 60 seconds, and heated at 350° C. for 2 hours for curing.

A migration test was carried out on the cured product in an environment of 85° C. and humidity 85% by applying a voltage of 20 V for 1,000 hours. A sample was rated "OK" when no electric conduction occurred until the end of the test and "NG" when electric conduction occurred during the test.

The components in Tables 2, 3 and 4 are identified below.

PIMEL: PIMEL® 18320, photosensitive polyimide by Asahi Kasei Microdevices Corp.

Crosslinker: tetrakis(methoxymethyl)glycoluril (Nikalac® MX-270 by Sanwa Chemical Co., Ltd.)

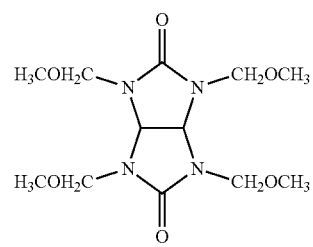

PAG: (p-tolylsulfoniumoxyimino)-p-methoxyphenylacetonitrile

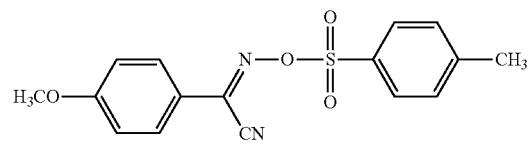 [SMILES: COc1ccc(/C(C#N)=N/OS(=O)(=O)c2ccc(C)cc2)cc1]

Solvent: cyclopentanone

TABLE 2

| Components | Example | | | | | | | | | |
|---|---|---|---|---|---|---|---|---|---|---|
| (pbw) | 1 | 2 | 3 | 4 | 5 | 6 | 7 | 8 | 9 | 10 |
| Resin 1 | 100 | 100 | 100 | — | — | — | — | — | — | — |
| Resin 2 | — | — | — | 100 | 100 | 100 | — | — | — | — |
| Resin 3 | — | — | — | — | — | — | 100 | 100 | 100 | — |
| PIMEL | — | — | — | — | — | — | — | — | — | 100 |
| Crosslinker | 20 | 20 | 20 | 20 | 20 | 20 | 20 | 20 | 20 | — |
| PAG | 2 | 2 | 2 | 2 | 2 | 2 | 2 | 2 | 2 | — |
| G-1 | 0.2 | 2 | 10 | 0.2 | 2 | 10 | 0.2 | 2 | 10 | 0.2 |
| G-2 | — | — | — | — | — | — | — | — | — | — |
| G-3 | — | — | — | — | — | — | — | — | — | — |
| G-4 | — | — | — | — | — | — | — | — | — | — |
| G-5 | — | — | — | — | — | — | — | — | — | — |
| G-6 | — | — | — | — | — | — | — | — | — | — |
| Solvent | 122 | 124 | 132 | 122 | 122 | 132 | 122 | 124 | 132 | 100 |
| Pattern formation | OK | OK | OK | OK | OK | OK | OK | OK | OK | OK |
| Bond force (MPa) | 31 | 34 | 38 | 14 | 15 | 18 | 14 | 17 | 21 | 29 |
| Migration test | OK | OK | OK | OK | OK | OK | OK | OK | OK | OK |

TABLE 3

| Components | Example | | | | | | | |
|---|---|---|---|---|---|---|---|---|
| (pbw) | 11 | 12 | 13 | 14 | 15 | 16 | 17 | 18 |
| Resin 1 | — | — | — | — | — | — | — | — |
| Resin 2 | — | — | — | — | — | — | — | — |
| Resin 3 | — | — | 100 | 100 | 100 | 100 | 100 | 100 |
| PIMEL | 100 | 100 | — | — | — | — | — | — |
| Crosslinker | — | — | 20 | 20 | 20 | 20 | 20 | 20 |
| PAG | — | — | 2 | 2 | 2 | 2 | 2 | 2 |
| G-1 | 2 | 10 | 15 | — | — | — | — | — |
| G-2 | — | — | — | 10 | — | — | — | — |
| G-3 | — | — | — | — | 10 | — | — | — |
| G-4 | — | — | — | — | — | 10 | — | — |
| G-5 | — | — | — | — | — | — | 10 | — |
| G-6 | — | — | — | — | — | — | — | 10 |
| Solvent | 102 | 110 | 137 | 132 | 132 | 132 | 132 | 132 |
| Pattern formation | OK | OK | OK | OK | OK | OK | OK | OK |
| Bond force (MPa) | 33 | 36 | 27 | 23 | 22 | 23 | 24 | 21 |
| Migration test | OK | OK | OK | OK | OK | OK | OK | OK |

TABLE 4

| Components | Comparative Example | | | | | | | | | | |
|---|---|---|---|---|---|---|---|---|---|---|---|
| (pbw) | 1 | 2 | 3 | 4 | 5 | 6 | 7 | 8 | 9 | 10 | 11 |
| Resin 1 | 100 | 100 | 100 | 100 | 100 | 100 | 100 | 100 | 100 | — | — |
| Resin 2 | — | — | — | — | — | — | — | — | — | — | 100 |
| Resin 3 | — | — | — | — | — | — | — | — | — | — | — |
| PIMEL | — | — | — | — | — | — | — | — | — | 100 | — |
| Crosslinker | 20 | 20 | 20 | 20 | 20 | 20 | 20 | 20 | 20 | — | 20 |
| PAG | 2 | 2 | 2 | 2 | 2 | 2 | 2 | 2 | 2 | — | 2 |
| G-1 | — | 0.05 | 20 | — | — | — | — | — | — | — | 0.05 |
| G-6 | — | — | — | 20 | — | — | — | — | — | — | — |
| S-2 | — | — | — | — | 10 | — | — | — | — | — | — |
| S-6 | — | — | — | — | — | 10 | — | — | — | — | — |
| nitric acid | — | — | — | — | — | — | 10 | — | — | — | — |
| sulfuric acid | — | — | — | — | — | — | — | 10 | — | — | — |
| phosphoric acid | — | — | — | — | — | — | — | — | 10 | — | — |
| Solvent | 122 | 122 | 142 | 142 | 132 | 132 | 132 | 132 | 132 | 100 | 122 |
| Pattern formation | OK | OK | NG | NG | NG | NG | NG | NG | NG | OK | OK |
| Bond force (MPa) | 15 | 18 | 40 | 33 | 12 | 13 | 6 | 7 | 6 | 15 | 10 |
| Migration test | OK | OK | OK | OK | OK | OK | NG | NG | NG | OK | OK |

It has been demonstrated that resin compositions within the scope of the invention exhibit better bonding forces than the comparative compositions and give satisfactory results in the pattern forming test and migration test. The inventive resin compositions have satisfactory characteristics as photosensitive material.

Japanese Patent Application No. 2018-206503 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) a resin having a phenolic hydroxyl group, and (B) an epoxy additive in the form of a compound containing 1 to 8 epoxy groups per molecule, containing at least one element selected from nitrogen, sulfur and phosphorus, and having a molecular weight of 50 to 6,000, the epoxy additive (B) being present in an amount of 0.1 to 18 parts by weight per 100 parts by weight of the resin (A), wherein the epoxy additive is a compound having the formula (9):

$$X^A_m-X^B \quad (9)$$

wherein m is an integer of 1 to 3, $X^A$ is a group selected from the group consisting of the following formulae:

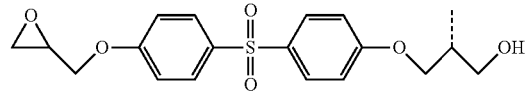

-continued

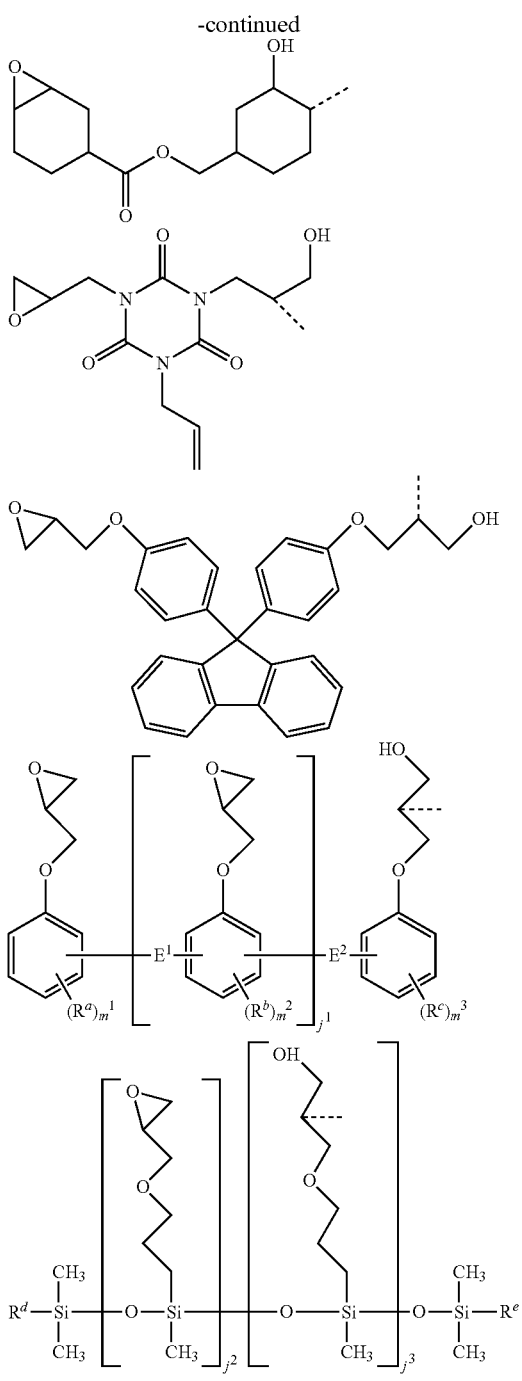

wherein, the broken line denotes a valence bond to $X^B$, $R^a$ to $R^e$ are each independently a $C_1$-$C_6$ monovalent hydrocarbon group, $E^1$ and $E^2$ are each independently a $C_1$-$C_{12}$ divalent hydrocarbon group, and the subscripts $m^1$, $m^2$ and $m^3$ are each independently an integer of 0 to 3, $j^1$ is an integer of 0 to 7, $j^2$ is an integer of 1 to 8, and $j^3$ is an integer of 1 to 3, and $X^B$ is a group selected from the group consisting of the following formulae:

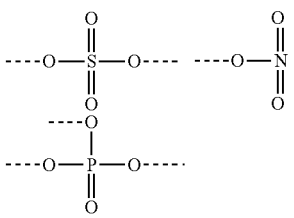

2. The composition of claim 1 wherein the resin (A) is at least one member selected from the group consisting of polybenzoxazole, polyimide, epoxy resins, and silicone-modified resins of the foregoing.

3. The composition of claim 1, further comprising (C) a crosslinker.

4. The composition of claim 1, further comprising (D) a photoacid generator.

5. The composition of claim 1, further comprising (E) an organic solvent.

6. A photosensitive resin coating obtained from the photosensitive resin composition of claim 1.

7. A photosensitive dry film comprising the photosensitive resin coating of claim 6.

8. A pattern forming process comprising the steps of:
   (i) using the photosensitive dry film of claim 7 to form a photosensitive resin coating on a substrate,
   (ii) exposing the photosensitive resin coating to radiation, and
   (iii) developing the exposed photosensitive resin coating in a developer.

9. A pattern forming process comprising the steps of:
   (i) using the photosensitive resin composition of claim 1 to form a photosensitive resin coating on a substrate,
   (ii) exposing the photosensitive resin coating to radiation, and
   (iii) developing the exposed photosensitive resin coating in a developer.

* * * * *